United States Patent

Kang et al.

[11] Patent Number: 5,910,452
[45] Date of Patent: Jun. 8, 1999

[54] METHOD FOR REDUCING ANTENNA EFFECT DURING PLASMA ETCHING PROCEDURE FOR SEMICONDUCTOR DEVICE FABRICATION

[75] Inventors: Tzong-Kuei Kang, Hsien; Huang-Chung Cheng, Hsinchu City; Chun-Hsing Shih, Taipei City; Chun-Hung Peng, Hsinchu City, all of Taiwan

[73] Assignee: Winbond Electronics Corporation, Taiwan

[21] Appl. No.: 08/645,087

[22] Filed: May 13, 1996

[51] Int. Cl.$^6$ .................................................. H01L 21/00
[52] U.S. Cl. ................................ 438/710; 438/694
[58] Field of Search .................. 156/643.1, 625.1, 156/644.1, 345; 437/228; 216/37, 67; 118/723 MR, 723 MA; 438/710, 694

[56] References Cited

U.S. PATENT DOCUMENTS

| | | | |
|---|---|---|---|
| 4,444,617 | 4/1984 | Whitcomb | 156/643 |
| 4,472,237 | 9/1984 | Deslauriers | 156/643 |
| 4,478,678 | 10/1984 | Watanabe | 156/463 |
| 5,013,401 | 5/1991 | Samukawa et al. | 156/643 |
| 5,259,923 | 11/1993 | Hori et al. | 156/643 |
| 5,350,710 | 9/1994 | Hong et al. | |
| 5,368,684 | 11/1994 | Ishikawa et al. | 156/643 |
| 5,425,843 | 6/1995 | Saul et al. | |
| 5,514,621 | 5/1996 | Tabara | 437/186 |
| 5,569,627 | 10/1996 | Shinohara et al. | 437/228 |

OTHER PUBLICATIONS

Watanabe and Yoshida, "Dielectric Breakdown of Gate Insulator Due to Reactive Ion Etching", *Solid State Technologies*, Apr. 1984, pp. 263–266.

Fang, Murukawa, and McVittie, "A New Model for Thin Oxide Degradation from Wafer Charging in Plasma Etching", Tech. Dig. IEDM, 1992, pp. 61–64.

*Primary Examiner*—Robert Kunemund
*Assistant Examiner*—Luz Alejandro
*Attorney, Agent, or Firm*—Rabin, Champagne, & Lynt, P.C.

[57] ABSTRACT

A method of semiconductor fabrication that reduces an antenna effect that can occur during a plasma etching procedure. The semiconductor device has circuitry fabricated over the surface of a silicon substrate and includes a gate structure having a gate oxide layer beneath a conductor layer. The method includes etching a polysilicon layer formed over the surface of the circuitry. The method also includes forming trenches in the polysilicon layer at the roots of sidewalls of gate structures of the semiconductor device, at an early stage of plasma etching, before the polysilicon layer has been completely consumed. The plasma may include a gas mixture of chlorine and oxygen. The gas mixture may have a chlorine/oxygen flow ratio of about 100/5 sccm.

14 Claims, 3 Drawing Sheets

METHOD FOR REDUCING ANTENNA EFFECT DURING PLASMA ETCHING PROCEDURE FOR SEMICONDUCTOR DEVICE FABRICATION

BACKGROUND OF THE INVENTION

1. Field of the Invention

The invention relates in general to a method for reducing the antenna effect, which occurs during plasma etching as would be performed during semiconductor device fabrication. In particular, the invention relates to a method employing a trench effect capable of substantially eliminating permanent damage to gate oxides in semiconductor devices, caused by the antenna effect during plasma etching fabrication.

2. Description of Related Art

Plasma etching is a technique widely utilized in the fabrication of VLSI (very large scale integration) semiconductor integrated circuit devices. In a plasma-filled environment, reactive ions generated in an ion discharge are accelerated by an electric field and collide with the wafer surface carrying the semiconductor device being fabricated. This is a high energy bombardment that well achieves the desired anisotropic etching characteristics for the device wafer being processed.

The plasma etching, however, also causes certain undesirable damage to the wafer. Glow discharge naturally results in electric charging in some regions over the wafer surface. Such charging is insignificant under normal conditions. However, if this charging occurs in a conductive layer region (for example, at the polysilicon gate) formed over the surface of the wafer, the resulting "antenna effect" causes excessive current by which the characteristics of a gate oxide layer located beneath the conductive layer can be severely degraded. The antenna effect occurs when interconnection conduction lines act as "antennas," amplifying the charging effect. One obvious reason for the vulnerability of gate oxide layers to such charging is that these layers are frequently fabricated as thin layers that may well be destructively penetrated if an electric field with excessive intensity as would cause a flow-through current, is present. This plasma-induced gate oxide damage is an critical issue in VLSI semiconductor fabrication processing.

In their paper, "Dielectric Breakdown of Gate Insulator due to RIE", Solid State Technology, April, 1984, p. 213, T. Watanabe and Y. Yoshida first reported the phenomenon of oxide damage during plasma etching procedures. A model was later proposed by Fang, S. Murakawa and J. P. McVittie in their paper "A New Model of Thin Oxide Degradation from Wafer Charging in Plasma Etching", Tech. Dig. IEDM 1992, at p. 61, in order to explain the mechanism responsible for such plasma-induced oxide damage. In the Fang et al. model, the plasma etching process that leads to the damage caused by electric charge build-up can be generally described as occurring in a sequence of three stages. FIGS. 1 to 3 of the accompanying drawings respectively schematically depict cross-sectional views respectively of a semiconductor device being plasma-etched in these three stages of the model of Fang et al.

FIG. 1 is a cross-sectional view of a semiconductor device in the initial stage of a conventional plasma etching procedure. Referring to FIG. 1, there is shown a silicon substrate 10 carrying semiconductor circuitry components such as the polysilicon gate structure. It may be observed that damage, caused by charge build-up in regions (if any) over the surface of the device wafer at this stage is barely possible. Such damage is rare because a doped polysilicon layer 12, most of which is to be subsequently etched away, still covers the entire surface area of the wafer. As the layer 12 is being etched by the plasma gas to form a doped polysilicon gate layer, non-uniformity of the plasma causes locally unbalanced ion and electron currents, which are signified by the positively- and negatively-signed arrows in the plasma ambient schematically shown in the drawing. During most of the actual etching process, the layer of polysilicon layer 12 continues to cover the wafer completely. The exposed polysilicon layer 12 therefore provides a low electrical resistance path across the surface of the device wafer so that surface currents can flow and balance the local non-uniformity in conduction current originating from the plasma. Therefore, virtually no charge can build up during this stage, and, accordingly, no oxide damage occurs.

In other words, the electric current induced by the presence of the ionized plasma ambient is able to flow without difficulty and discharge via the polysilicon layer 12, as is schematically shown in the drawing by the arrows pointing from the plasma ambient into and horizontally along the polysilicon layer 12. Thus, electrical charges are well prevented from accumulating over any of the surface regions of the device wafer in this stage of the plasma etching procedure.

Thus, during the initial stage of a plasma etching procedure when the coverage of the polysilicon layer 12 is still mostly intact, the electrically charged plasma ambient poses no threat to the semiconductor structure of the wafer, including the vulnerable oxide layer 18 that is to become part of the gate of a fabricated device. As is seen in FIG. 1, the gate oxide layer 18 is beneath the polysilicon layer 12 and is defined geometrically by the shape of a photoresist layer 14, as well as field oxide layers 16 surrounding it.

FIG. 2 shows a cross-sectional view of the semiconductor device of FIG. 1 in a following stage, near the conclusion of the plasma etching procedure. Referring to FIG. 2, as the etching procedure continues, the exposed regions of the polysilicon layer 12 are eventually consumed, forming isolation regions 13. That is, the isolation regions 13 are those portions in the etched polysilicon layer 12 that are completely consumed before other portions, due to the fact, for example, that the polysilicon layer is not of completely uniform thickness, so that thinner portions are consumed earlier.

The regions 13 cut the polysilicon layer 12 into independent island regions that include gate polysilicon layer 12' beneath the photoresist layer 14. Thus, the long surface conduction paths across the device wafer eventually become electrically resistive, or discontinuous, so that surface current paths that were convenient for electrical discharge are now broken. Meanwhile, gate electrode islands start to appear, and the phenomenon of local charge build-up may well begin.

At this stage, the discontinuities in the surface conduction paths across the surface of the device wafer begin to block the smooth discharge of electrical charges that may have accumulated, as the polysilicon layer 12 is gradually consumed and forms islands that are isolated from each other. This is schematically signified in the drawing by the positive charge signs above the surface of the polysilicon layer 12. Accumulation of such charges eventually establishes significant electric potential fields between the polysilicon layer 12 and the silicon substrate 10. When the level of the electric field approaches a certain threshold, an undesirable current discharge will commence, most likely through the vulnerable gate oxide layer 18.

Essentially, when the gate is sufficiently charged, sufficient Fowler-Nordheim tunneling current to induce permanent damage to the gate oxide 18 will occur, leaving the device being thus fabricated unsatisfactory for its designed use. The electric charge ratio is determined by factors that include the net local current imbalance and the amount of exposed gate area in the islands. The positive charge from the charge current is collected in the halo region in the polysilicon layer 12, around the gate island.

However, in a third, overetching stage of the plasma etching procedure, as is depicted in FIG. 3, the electrical charging phenomenon present in the second stage goes away. This is explained as follows.

Referring to FIG. 3, during the overetching stage, the halo region around the gate island in the etched gate polysilicon layer 12 eventually disappears. Only gate electrode edges, or sidewalls 19, of the gate polysilicon layer 12' are now exposed to the etching plasma ambient. All other portions of the polysilicon layer 12, external to the gate structure, are now completely consumed by the etching. Charge collection decreases significantly because of the small sidewall surface area of the gate electrode. Further damage to the gate oxide is thus unlikely beyond this stage of the plasma etching procedure.

The gate oxide damage arising in the above-described second (near-conclusion) stage is generally known to result from the antenna effect. From the mechanism described by Fang et al., it is apparent that the antenna effect mainly results from the collection of charge in the halo region of the polysilicon layer around the gate structure when the plasma etching procedure is in its near-conclusion stage. The non-uniformity of charge distribution in the plasma ambient does not cause charge build-up during either of the initial and overetching stages of the etching procedure. This model developed by Fang et al. is reasonably supported by plasma measurement results and SPICE simulations, as well as by examinations of damage resulting from plasma etching.

It is also important to note that the type of oxide damage that would be expected to occur during etching of polysilicon according to the above model, would also be expected to occur during plasma etching of other conductors, including, for example, aluminum layer. Further, non-uniformity in a plasma (which is the primary cause of the antenna effect) is not limited to RIE (reactive ion etching) and MERIE (magnetically-enhanced reactive ion etching) plasma etching reactors. It can also occur in advanced high density plasma(HDP) reactors, such as electron-cyclotron resonance (ECR) reactors, as well as in inductively-coupled plasma (ICP) reactors.

To solve the problem of antenna effect-induced oxide damage during plasma etching in VLSI semiconductor device fabrication, various approaches have been taken. For example, one approach is to reduce the excitation frequency during ion discharge; another is to modify the electrode design. These approaches, however, are unable to completely remedy the non-uniformity of charge distribution in the plasma ambient which leads to the antenna effect.

Another method that has been tried involves attempts to improve the oxide quality so that it can withstand the antenna-effect-induced damage. However, improvement of oxide quality beyond that necessary for the normal operation of the fabricated semiconductor device would require additional device fabrication process steps that increase both the complexity and the cost of the fabricated device.

Other methods have utilized circuit design techniques to limit the conductive area or edge. This approach, however, places restrictions on the flexibility of semiconductor circuit design, and the circuitry layout is inevitably larger, which conflicts with the trend toward further device miniaturization.

For example, U.S. Pat. No. 5,350,710 entitled "Device for Preventing Antenna Effect on Circuit" issued to United Microelectronics Corporation of Taiwan on Sep. 27, 1994, as well as U.S. Pat. No. 5,425,843 entitled "Process for Semiconductor Device Etch Damage Reduction Using Hydrogen-containing Plasma" issued to Hewlett-Packard Company of the U.S.A. on Jun. 20, 1995, disclose circuit techniques and post-treatment procedures used to solve the plasma damage problem. Results of these techniques and procedures, however, have failed to completely eliminate oxide damage and at the same time have increased the complexity of, and imposed more limitations on, the fabrication processes.

SUMMARY OF THE INVENTION

It is therefore an object of the invention to provide a method of semiconductor device fabrication that is capable of preventing the gate oxide region thereof from sustaining damage caused by a build-up of antenna effect-induced electric charge during plasma etching procedures.

To achieve the above-identified and other objects, the invention provides a method of semiconductor device fabrication that subjects the device to a reduced antenna effect during plasma etching. The method is applied to a semiconductor device that has circuitry fabricated over the surface of a silicon substrate and includes gate structures having gate oxide layers beneath a conductive layer. According to the invention, plasma etching is performed on a polysilicon layer provided over the surface of the circuitry. Trenches are formed in the polysilicon layer at the root of sidewalls of the gate structure, at an early stage of the plasma etching procedure, before the polysilicon layer has been completely consumed.

According to another aspect of the invention, the process further achieves the above-identified and other objects by providing a method for semiconductor fabrication that reduces the antenna effect during plasma etching, by including in the plasma a gas mixture of chlorine and oxygen.

In still another aspect of the invention, the process further achieves the above-identified object by providing a method for semiconductor fabrication that reduces the antenna effect during plasma etching procedure, by setting the flow rates of chlorine to oxygen in the plasma mixture at about 100/5 sccm.

BRIEF DESCRIPTION OF THE DRAWINGS

Other objects, features, and advantages of the invention will become apparent from the following detailed description of the preferred but non-limiting embodiment. The description is made with reference to the accompanied drawings in which:

FIG. 4 and 5 are schematic cross-sectional views of a semiconductor device being etched in a plasma ambient at

DESCRIPTION OF THE PREFERRED EMBODIMENTS

As mentioned above, when the problem of charge build-up that causes gate oxide damage during the conclusion stage of the plasma etching procedure was examined, it was determined that the damage to the vulnerable gate oxide layer is the result of Fowler-Nordheim tunneling current induced by accumulated charges. As is evident in FIG. 2, the charge collected within the halo region of the etched polysilicon layer, which generally surrounds the edges of the conductor of the gate structure, is the primary contributor to the electric field established for the destructive Fowler-Nordheim current.

The gate structure may be identified in FIG. 2 by structure below the photoresist layer 14. The halo region surrounding the gate structure is one of the conducting paths over the device wafer surface that is gradually isolated at the stage of the plasma etching procedure when the polysilicon layer 12 is being gradually consumed. The method according to the invention for reducing the antenna effect during a plasma etching procedure of a semiconductor device fabrication, concentrates on the elimination of this halo region in the etched polysilicon layer at the conclusion stage of the plasma etching.

Figure 4:
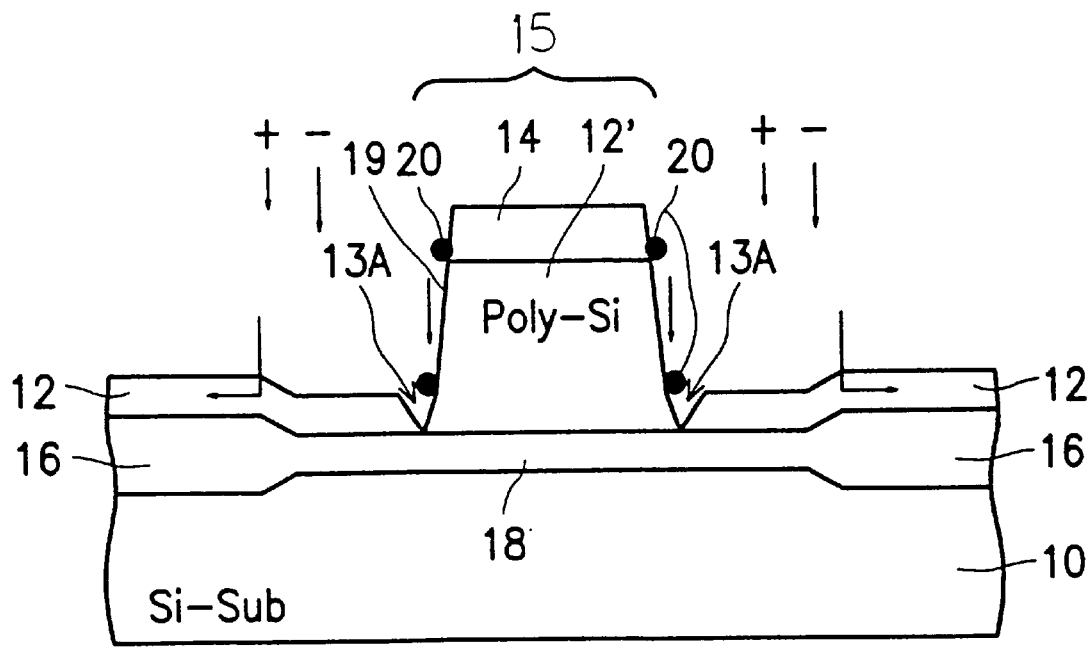

A description of the method of the invention is now provided with reference to FIG. 4 of the drawings. FIG. 4 schematically shows a cross-sectional view of a semiconductor device being etched in a plasma ambient at the conclusion stage, utilizing the method according to a preferred embodiment of the invention. Similarly to the case in the conventional etching procedure depicted in FIG. 2, the polysilicon layer 12 is shown to be partially consumed.

As is shown in FIG. 4, at the conclusion stage of the plasma etching procedure, trenches 13A are formed immediately at the root of the sidewalls 19 of the gate structure 15 before the portion of polysilicon layer 12 surrounding the gate structure 15 is completely consumed. The presence of these trenches 13A at this stage, immediately at the root of the sidewalls 19 of the gate structure 15, results in an effect referred to herein as the "trench effect". This trench effect is responsible for the capability of the present inventive method to prevent antenna effect-induced damage to the vulnerable gate oxide layer 18 of the gate structure 15 during plasma etching procedures.

The trenches 13A can prevent the occurrence of undesirable Fowler-Nordheim tunneling current that would otherwise permanently degrade the gate oxide characteristics. The effectiveness of the trenches can be explained as follows. First of all, the gate oxide layer 18 is essentially the oxide layer located directly beneath the gate polysilicon layer 12' as defined by the photoresist layer 14 thereabove. Without the residual polysilicon layer 12 extending outwardly from the root of sidewalls 19 as in the conventional case of FIG. 2, there is substantially no occasion when electric charges may accumulate to establish the electric field across the gate oxide layer 18. An undesirable, destructive Fowler-Nordheim tunneling current punching through the gate oxide layer 18 as in the conventional case, is therefore substantially impossible when the etching provides trenches at the roots of the sidewalls 19.

Figure 1:
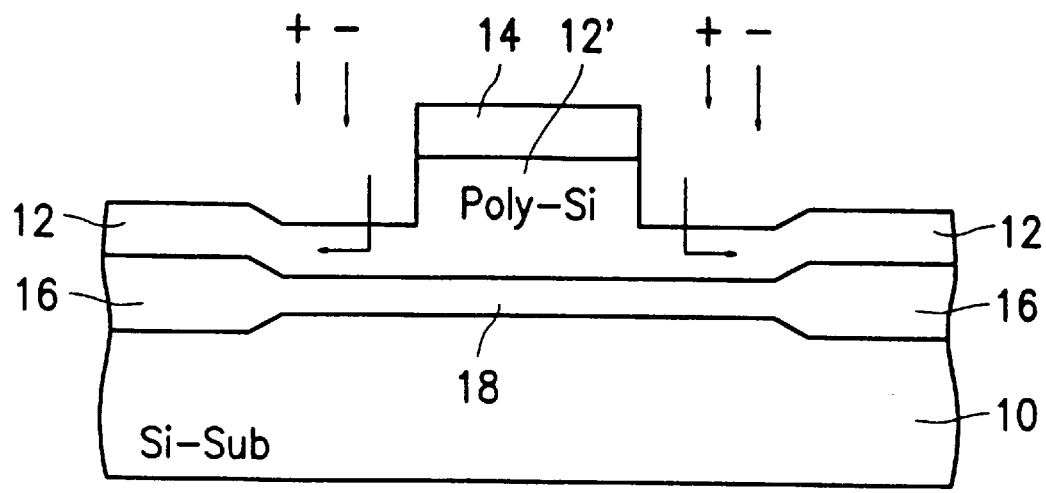
FIG. 1 is a schematic cross-sectional view of a semiconductor device, in an initial stage of a conventional plasma etching procedure.
Figure 2:
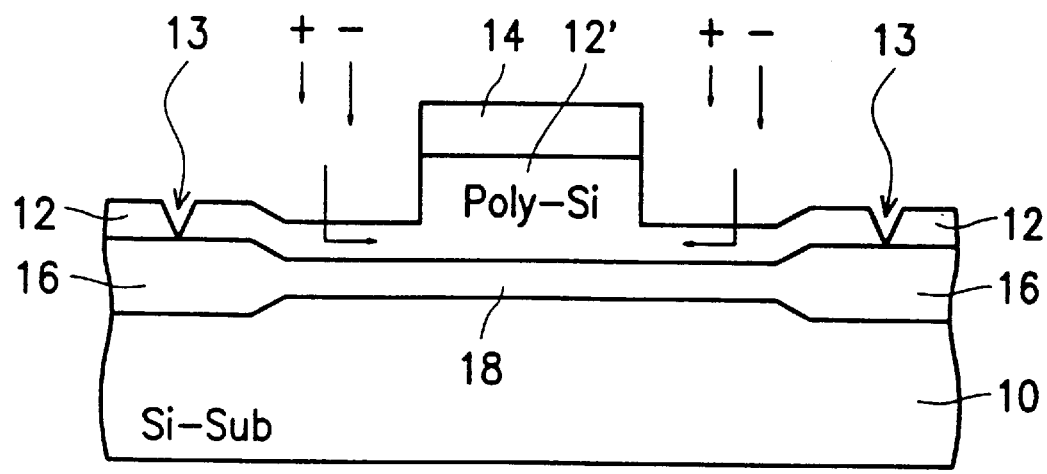
FIG. 2 is a schematic cross-sectional view of the semiconductor device of FIG. 1, at a conclusion stage of the conventional plasma etching procedure.
Figure 3:
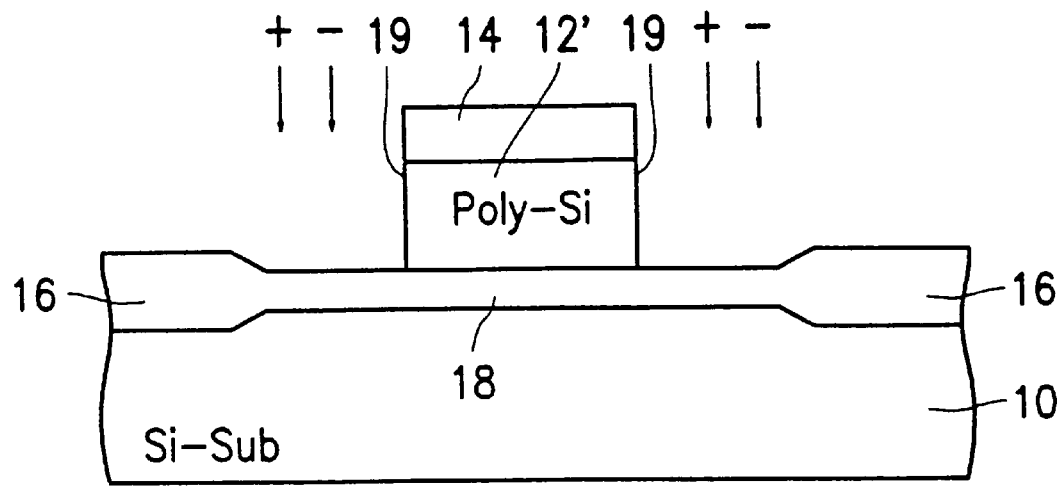
FIG. 3 is a schematic cross-sectional view of the semiconductor device of FIG. 1, at an overetching stage of the conventional plasma etching procedure.

On the other hand, at the conclusion stage of the plasma etching procedure, in addition to trenches 13A that are formed in the etched polysilicon layer 12 at the root of the sidewalls 19, there are also the isolation regions 13 formed in the polysilicon layer 12 at other locations, as was shown in FIG. 2 (but not shown in FIG. 4). The broken conductor paths so defined over the surface of the device wafer also serve to the conduction of charging current away from the gate structure 15 until they become completely isolated. This is schematically depicted in FIG. 4 by the arrows pointing from the plasma ambient into the etched polysilicon layer 12. Such conduction paths aid conduction away from the gate structure 15, because, although conduction paths over the surface of the device wafer are becoming broken and eventually isolated, they still allow for the accumulated charges to be discharged, but not, of course, through the gate oxide layer 18 so as to cause damage.

It should be indicated, however, that at a certain point the trenches 13A at the root of the sidewalls 19 of the gate structure 15 must reach the bottom surface of the etched polysilicon layer 12. This physically separates the portions 12' of the polysilicon 12 included in the gate structure 15 and the portions covering the field oxide layers 16, before the gate oxide layer 18 beneath the gate structure 15 can experience damage from current caused by charge accumulated due to the antenna effect. In other words, during the plasma etching procedure, polysilicon material in the trenches 13A immediately at the sidewall roots of the gate structure 15 must be completely consumed long before the entire portion of the polysilicon layer 12 exposed for etching, is completely removed in order to protect the gate oxide layer 18.

As mentioned above in relation to the Fang et al. model, the potential damage to the vulnerable gate oxide layer is only possible at the conclusion stage of the plasma etching procedure. At this stage, the presence of isolation regions physically separating the isolated conduction paths of polysilicon islands over the surface of the device wafer, is a condition leading to the damage of the gate oxide layer by the Fowler-Nordheim tunneling current in the conventional plasma etching technique. However, the presence of the same isolation regions at the same stage in the case of the plasma etching procedure of the invention is a factor contributing to the prevention of damage to the vulnerable gate oxide layer, although particular trenches at the root of the sidewall of the gate structure 15 must be present as well.

Thus, an underlying concept of the invention is that by eliminating the halo region surrounding the gate structure, charge accumulation across the gate oxide layer is eliminated. The conventional plasma etching procedures do not include formation of trenches immediately at the root of the sidewalls of the gate structure. Conventional plasma etching procedures therefore produce a halo region surrounding the gate structure, which invites the accumulation of electric charge produced in the plasma ambient, due to charge imbalances in the gas plasma. The concept of the invention relies on trench formation at the root of the sidewall gate structure, during the conclusion stage of the plasma etching procedure. The following paragraphs describe an embodiment of the method of the invention by which such trench formation is automatically effected at the root of sidewalls of the gate structure.

FIG. 4 schematically depicts the phenomenon of this trench effect concept of the invention which is characterized by the prevention of the formation of a halo region immediately around a gate structure of a semiconductor device being fabricated. In one embodiment, the method of the invention is performed using a chlorine/oxygen gas mixture having a moderate $Cl_2/O_2$ flow ratio, as an ECR plasma etchant during polysilicon etching. For example, as confirmed by tests performed by the applicant, a $Cl_2/O_2$ flow ratio of about 100/5 sccm is adequate to successfully create the trench effect according to the invention. Tests performed at a lower $Cl_2/O_2$ flow ratio of about 95/5 sccm, for example, failed to provide an acceptable trench effect at the root of sidewall of the gate structure.

Referring to FIG. 4, chlorine atoms 20 in a $Cl_2/O_2$ gas mixture having a moderate flow ratio of about 100/5 sccm, tend to flow along the edge (that is, sidewalls 19) of the polysilicon gate structure 15. This tendency invites ion bombardment at these edges with relatively higher etching rate than elsewhere over the surface of the device wafer. This leads to the highest etch rate being around the gate region. This phenomenon results in the formation of the trenches immediately at the root of sidewalls 19 of the gate structure 15. In other words, since chlorine atoms 20 in a $Cl_2/O_2$ mixture having a suitable flow ratio tend to etch the sidewalls 19 of the gate structure 15 more heavily than elsewhere, the trenches 13A are formed early in the conclusion stage of the etching procedure, and the otherwise charge-accumulating halo regions around the gate structures are completely consumed early in this stage as well.

Thus, the electric charge build-up phenomenon is avoided even when nonuniformity exists in the gas plasma (FIG. 4). As mentioned above, a $Cl_2/O_2$ flow ratio of about 100/5 sccm optimizes the desired trench effect. The charge accumulation phenomenon across the gate oxide layer 18 is therefore no longer a concern when the plasma etching is performed according to the above-described procedure of the invention. This is because the presence of the trenches 13A immediately at the root of sidewalls 19 of the gate structure 15 prevents the formation of a halo region, which in turn prevents any electric charge accumulation.

Further, the ECR type of HDP system is known to be able to provide relatively high polysilicon/oxide selectivity. The silicon substrate 10 beneath the gate oxide region 18 can therefore be effectively free of direct bombardment by the etching ions.

The embodiment described above exemplifies the usefulness of the invention in relation to a gate structure. The method, however, is similarly applicable in relation to the formations of other metallizations or interconnections in the semiconductor device being fabricated, during the respective plasma etching procedures thereof.

Figure 5:
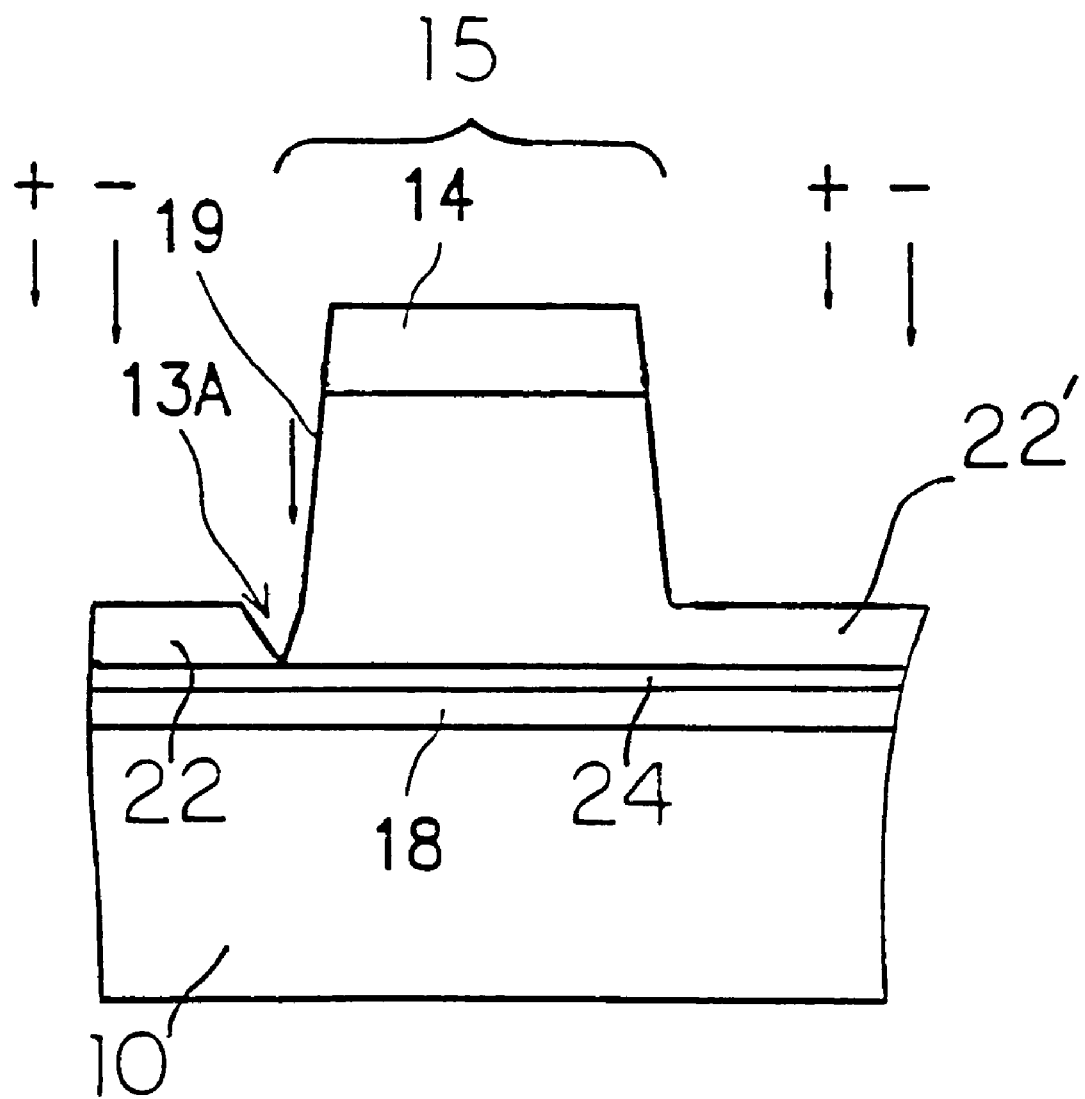

For example, as shown in FIG. 5, in the case of making an interconnection, bonding pad or metallization layer, the use of a conductor sidewall root trench 13A at a root of the sidewall 19 of a portion of a layer 22 covered by mask 14, to avoid the formation of a halo region surrounding a residual conductive layer, is similarly applicable. Thus, the method is applicable in the case of a metallization layer 22 provided above a planarization layer 24 where the metallization layer 22 is etched with a plasma so as to form a metallization 22 of the device. Failure to avoid the formation of such a halo region would allow similar permanent damage to occur in the gate oxide layer 18 therebelow. In the case of some interconnections and bonding pads, this is because they are also electrically connected to the gate structure 15. Charge accumulation in the halo regions surrounding these interconnections and bonding pads would also be subjected to Fowler-Nordheim tunneling current that rushes into the device substrate 10 and damages the gate oxide 18.

While the invention has been described by way of example and in terms of a preferred embodiment, it is to be understood that the invention is not be limited to the disclosed embodiment. To the contrary, it is intended to cover various modifications and similar arrangements included within the spirit and scope of the invention. The scope of the appended claims therefore should be accorded the broadest interpretation so as to encompass all such modifications and similar structures.

What is claimed is:

1. A method of fabricating a semiconductor device wherein the semiconductor device includes a gate oxide and a conductive layer respectively formed over a surface of a silicon substrate, the semiconductor device further having a gate structure formed from a portion of the conductive layer, so as to be positioned over the gate oxide layer, said method including:

etching the conductive layer with a plasma, so as to form a trench entirely through the conductive layer at a root of a sidewall of the gate structure, thereby providing a gap that physically separates the conductive layer from the gate structure.

2. The method of claim 1, wherein the conductive layer is a polysilicon layer.

3. The method of claim 2, wherein the plasma includes a gas mixture of chlorine and oxygen ions.

4. The method of claim 3, wherein the gas mixture has a chlorine/oxygen flow ratio of about 100/5 sccm.

5. The method of claim 4, wherein said of etching with a plasma is performed in an electron-cyclotron resonance plasma etching system.

6. The method of claim 1, wherein said etching with a plasma is performed in an electron-cyclotron resonance plasma etching system.

7. A method of fabricating a semiconductor device wherein the semiconductor device includes, a conductive layer over a surface of a silicon substrate, and a mask layer covering a portion of the conductive layer, wherein the portion defines a gate structure, said method including:

etching the conductive layer with a plasma, so as to form a trench entirely through the conductive layer at a root of a sidewall of the gate structure, thereby providing a gap that physically separates the gate structure from the conductive layer.

8. The method of claim 7, wherein the conductive layer is a metallization layer provided above a planarization layer, and said etching with a plasma etches the metallization layer so as to form a metallization for the semiconductor device.

9. The method of claim 8, wherein the metallization is electrically connected to the gate structure.

10. In a method of fabricating a semiconductor device wherein the semiconductor device includes a gate oxide and a conductive layer respectively formed over a surface of a silicon substrate, the semiconductor device further having a gate structure formed from a portion of the conductive layer, so as to be positioned over the gate oxide layer, said method including:

etching the conductive layer with a plasma; having
    a gas mixture of chlorine and oxygen ions with a chlorine/oxygen flow ratio of about 100/5 sccm, so as to form a trench-entirely through the conductive layer at a root of the sidewall of the gate structure, thereby providing a gap that physically separates the conductive layer from the gate structure.

11. The method of claim 10, wherein said etching with a plasma is performed in an electron-cyclotron resonance plasma etching system.

12. A method of fabricating a semiconductor device wherein the semiconductor device includes a gate oxide and a conductive layer respectively formed over a surface of a silicon substrate, the semiconductor device further having a gate structure formed from a portion of the conductive layer, so as to be positioned over the gate oxide layer, said method including:

etching the conductive layer with a plasma, said etching including defining conduction paths for directing current away from the gate structure, and then breaking all of the conduction paths by etching entirely through the conductive layer in the conduction paths; and before said breaking all of the conduction paths, forming a trench entirely through the conductive layer at a root of a sidewall of the gate structure, thereby providing a gap that physically separates the conductive layer from the gate structure; and completely removing the conductive layer surrounding the gate structure.

13. The method of claim 12, wherein the conductive layer is a polysilicon layer and the plasma includes a gas mixture of chlorine and oxygen ions.

14. The method of claim 13, wherein the gas mixture has a chlorine/oxygen flow ratio of about 100/5 sccm.

* * * * *